United States Patent
Karp et al.

(10) Patent No.: US 10,901,097 B1
(45) Date of Patent: Jan. 26, 2021

(54) METHOD AND APPARATUS FOR ELECTRONICS-HARMFUL-RADIATION (EHR) MEASUREMENT AND MONITORING

(71) Applicant: Xilinx, Inc., San Jose, CA (US)

(72) Inventors: James Karp, Saratoga, CA (US); Michael J. Hart, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 361 days.

(21) Appl. No.: 15/912,088

(22) Filed: Mar. 5, 2018

(51) Int. Cl.
    *G01T 1/02* (2006.01)
    *G01R 31/28* (2006.01)

(52) U.S. Cl.
    CPC ............ *G01T 1/02* (2013.01); *G01R 31/2851* (2013.01)

(58) Field of Classification Search
    CPC .... G01T 1/02; G01R 31/2851; G01R 31/303; G01R 31/307
    See application file for complete search history.

(56) References Cited

U.S. PATENT DOCUMENTS

| | | | |
|---|---|---|---|
| 6,838,899 B2* | 1/2005 | Plants | G06F 11/1008 326/10 |
| 6,901,532 B2* | 5/2005 | Deruiter | G11C 11/4125 714/49 |
| 7,036,059 B1 | 4/2006 | Carmichael et al. | |
| 7,576,557 B1* | 8/2009 | Tseng | H03K 19/17752 326/14 |
| 7,673,202 B2* | 3/2010 | Chung | G01R 31/31816 714/726 |
| 8,399,845 B2 | 3/2013 | Fechner et al. | |
| 8,635,581 B1 | 1/2014 | Tseng et al. | |
| 10,437,666 B2* | 10/2019 | Engin | G11C 29/52 |
| 2007/0234125 A1* | 10/2007 | Lien | G01R 31/31816 714/37 |
| 2008/0281572 A1* | 11/2008 | Puri | G06F 30/20 703/16 |
| 2010/0163756 A1* | 7/2010 | McPeak | G11C 29/56008 250/492.21 |
| 2011/0040354 A1* | 2/2011 | Hoyme | G06F 11/0736 607/60 |
| 2012/0144244 A1* | 6/2012 | Dan | G11C 29/56 714/39 |
| 2018/0149695 A1* | 5/2018 | Uezono | G01R 31/2601 |

OTHER PUBLICATIONS

Hussein, Jameel et al., "Mitigating Single Event Upsets," WP395 (v1.1), May 19, 2015, pp. 1-11, Xilinx, Inc., San Jose, California, USA.
Karp, James et al., "Single Event Latch-up: Increased Sensitivity from Planar to FinFET," Xilinx Presentation, Jul. 19, 2017, 16 pgs.; Xilinx, Inc., San Jose, California, USA.

* cited by examiner

*Primary Examiner* — Mohamed Charioui
(74) *Attorney, Agent, or Firm* — Haynes and Boone, LLP (57) ABSTRACT

An electronics-harmful-radiation (EHR) monitoring system includes an EHR measurement circuit. The EHR measurement circuit includes a first device, a single event upset (SEU) detector circuit configured to determine a first number of SEUs of the first device during a first period, and an EHR measurement generator configured to generate a first EHR value based on the first number of SEUs and the first period.

20 Claims, 5 Drawing Sheets

METHOD AND APPARATUS FOR ELECTRONICS-HARMFUL-RADIATION (EHR) MEASUREMENT AND MONITORING

TECHNICAL FIELD

Examples of the present disclosure generally relate to integrated circuits ("ICs") and, in particular, to an embodiment related to electronics-harmful-radiation measurement and monitoring.

BACKGROUND

A radiation dosimeter measures exposure to ionizing radiation. Typically, radiation dosimeters rely on current measurements or scintillation counts. For example, a radiation dosimeter may use a scintillation counter for detecting and measuring ionizing radiation by using the excitation effect of incident radiation on a scintillator material, and detecting the resultant light pulses. However, such radiation dosimeters typically do not directly relate to electronics malfunctions.

Accordingly, it would be desirable and useful to provide an improved method and system for radiation measurement and monitoring.

SUMMARY

In some embodiments in accordance with the present disclosure, an electronics-harmful-radiation (EHR) monitoring system includes an EHR measurement circuit. The EHR measurement circuit includes a first device; a single event upset (SEU) detector circuit configured to determine a first number of SEUs of the first device during a first period; and an EHR measurement generator configured to generate a first EHR value based on the first number of SEUs and the first period.

In some embodiments, the first device includes a memory.

In some embodiments, the EHR measurement generator is further configured to generate the first EHR level based on a size of the memory.

In some embodiments, the EHR monitoring system includes an EHR estimation circuit configured to generate a second EHR value associated with a second device based on the first EHR value.

In some embodiments, the EHR estimation circuit is configured to: determine a first technology node for fabricating the first device; determine a second technology node for fabricating the second device; and generate the second EHR value based on the first and second technology nodes.

In some embodiments, the first and second technology nodes are the same.

In some embodiments, the first and second technology nodes are different.

In some embodiments, the EHR estimation circuit is configured to: determine an EHR correction value associated with the first and second technology nodes; and generate the second EHR value by applying the EHR correction value to the first EHR value.

In some embodiments, the first device is in a first integrated circuit (IC), and the second device is in a second IC.

In some embodiments, the first device and second device are at a same location.

In some embodiments, a method includes determining, by a single event upset (SEU) detector circuit, a first number of SEUs of a first device during a first period; and generating, by an EHR measurement generator, a first EHR value based on the first number of SEUs and the first period.

In some embodiments, the method includes generating, by the EHR measurement generator, the first EHR level based on a size of the memory.

In some embodiments, the method includes generating a second EHR value associated with a second device based on the first EHR value.

In some embodiments, the method includes determining a first technology node for fabricating the first device; determining a second technology node for fabricating the second device; and generating the second EHR value based on the first and second technology nodes.

In some embodiments, the method includes determining an EHR correction value associated with the first and second technology nodes; and generating the second EHR value by applying the EHR correction value to the first EHR value.

Other aspects and features will be evident from reading the following detailed description and accompanying drawings.

DETAILED DESCRIPTION

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. As discussed above, typical radiation dosimeters do not directly relate to electronics malfunctions. For integrated circuit (IC) solutions, it has been discovered that by measuring electronics harmful radiation (EHR), defined as radiation that induces harmful effects to semiconductor electronics devices, radiation directly related to electronics malfunctions may be measured. Further, suitable corrective actions/mitigation schemes may be performed based on the EHR measurements. In some embodiments, by using single event upset (SEU) counts of a device (e.g., a memory), an EHR measurement that is only for EHR related to ionization tracks in semiconductor may be achieved in an instantaneous dynamic mode, where the EHR measurement is updated dynamically based on updated SEU information. Further, such an EHR measurement may be immediately used to predict and/or monitor EHR event rates for other semiconductor devices in the same or similar environment.

Various advantages may be present in various applications of the present disclosure. No particular advantage is required for all embodiments, and different embodiments may offer different advantages. One of the advantages of some embodiments is that by using SEU counts in a device (e.g., a memory), EHR measurements that are only related to EHR are achieved in an instantaneous dynamic mode. Another advantage of some embodiments is that because the EHR measurements are based on SEU counts for detecting the amount of ionizing tracks that are harmful to electronics in general, such EHR measurements do not require calibration because they are not provided for spectral evaluation of radiation. Yet another advantage of some embodiments is that by using resources in existing devices (e.g., memories in an FPGA), such EHR measurements may require almost no additional hardware costs. Yet another advantage of some embodiments is that such EHR measurements may be immediately used to predict and/or monitor EHR event rates for other semiconductor devices in the same or similar environment.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 1:
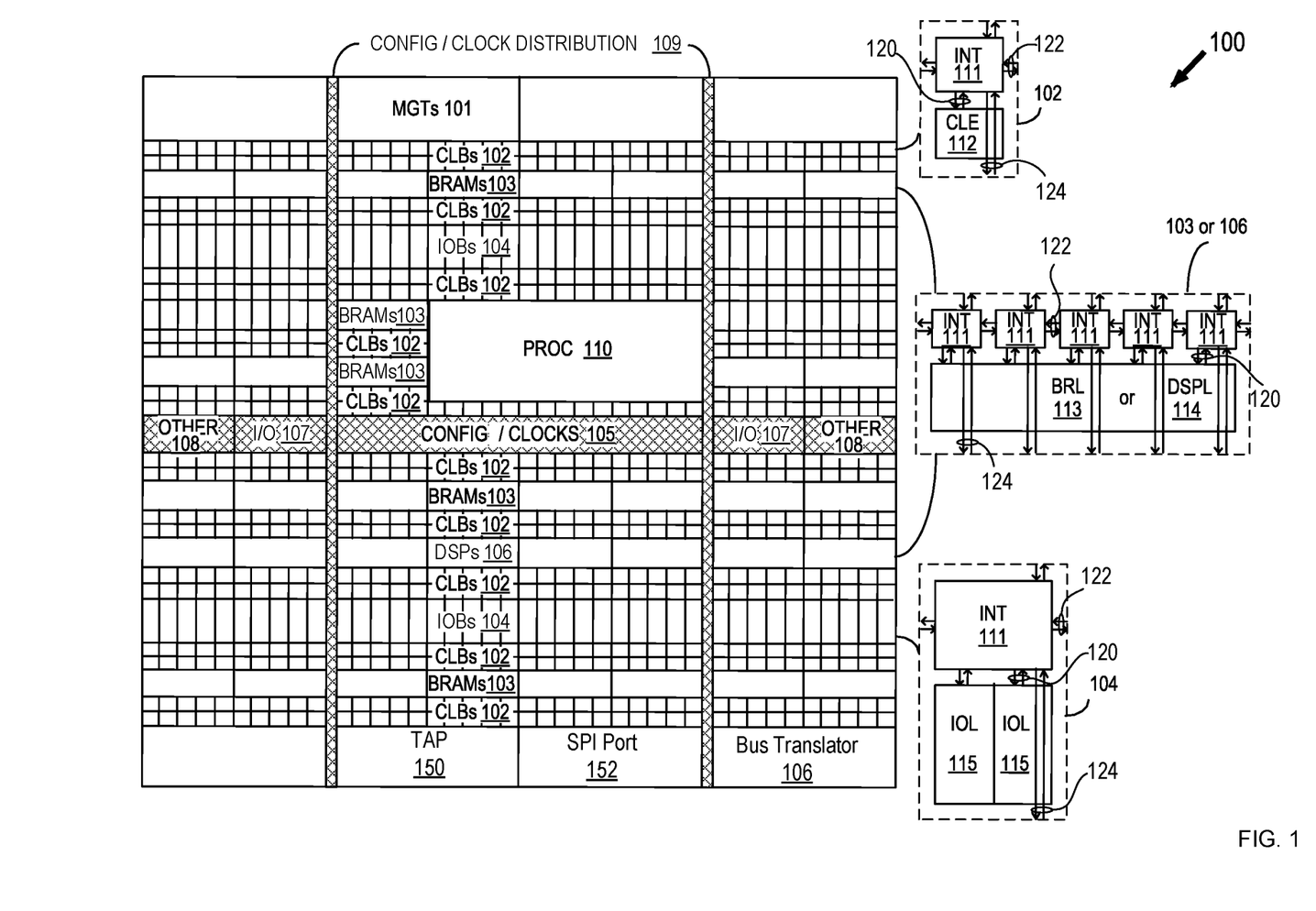
FIG. 1 is a block diagram illustrating an exemplary architecture for an IC according to some embodiments of the present disclosure.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the one or more embodiments described herein is not limited to the exemplary IC depicted in FIG. 1, and that IC having other configurations, or other types of IC, may also implement those embodiments.

Manufacturers of systems expected to be exposed to significant levels of radiation, including space-bound systems, favor the lower cost, easier and faster system development, and increased performance of commercial off-the-shelf technology such as FPGAs. In particular, FPGAs offer flexibility and fast in-circuit reconfiguration that makes them ideal for use in spacecraft and other systems requiring remote, on-the-fly reprogramming. Concerns arise, however, with the ability of technology designed for use on earth to perform reliably in a high-radiation environment. Such reliability is measured in terms of susceptibility to long-term absorption of radiation, referred to as total ionizing dose (TID), and effects caused by the interaction of a single energetic particle, referred to as single event effects (SEE).

The main sources of energetic particles contributing to SEEs in space include trapped energetic particle radiation, including oxygen ions and protons; galactic cosmic ray protons and heavy ions, including heavy iron nuclei; and alpha particles and heavy ions and protons from solar flares. The exposure of a spacecraft's electronic systems to these hazards depends on the spacecraft's orbit or trajectory, the timing of its launch and duration in space, and the timing of system deployment and operation.

An SEE occurs when a single particle strikes a sensitive point on a susceptible device and deposits sufficient energy to cause either a hard or soft error. A soft error, also referred to as a single event upset (SEU), is a change of state caused by one single ionizing particle (e.g., ions, electrons, photons) striking a sensitive node in a micro-electronic device, such as in a microprocessor, semiconductor memory, or power transistors. The state change is a result of the free charge created by ionization in or close to an important node of a logic element (e.g. a memory "bit"). The error in device output or operation caused as a result of the strike is called an SEU or a soft error. As described below with reference to FIGS. 2, 3, 4, and 5, an EHR monitoring system may use SEU counts of a particular device for EHR measurement, and use such EHR measurement for EHR estimation for other devices.

Figure 2:
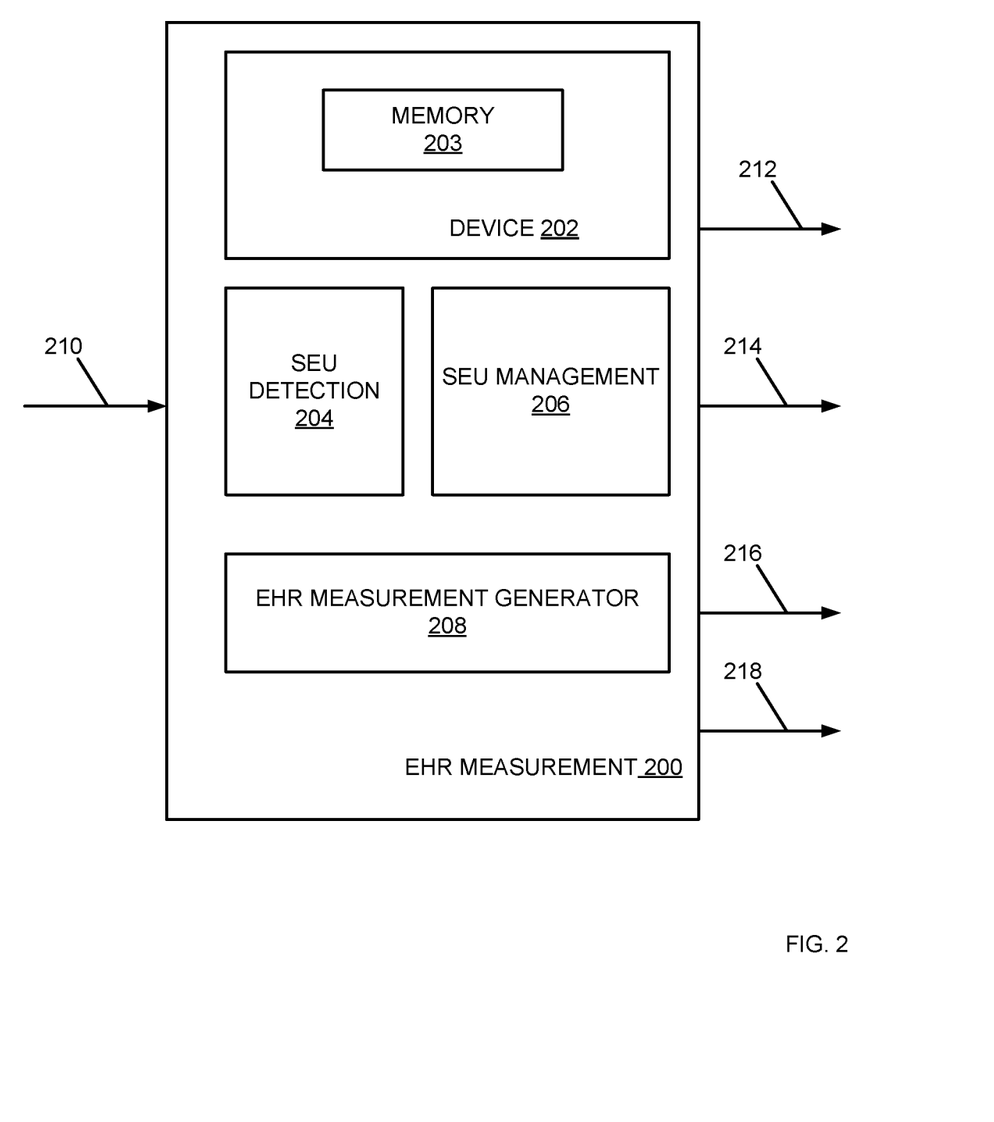
FIG. 2 is a block diagram illustrating an EHR measurement circuit according to some embodiments of the present disclosure.

Referring to FIG. 2, illustrated is an EHR measurement circuit 200. The EHR measurement circuit 200 includes a device 202 (e.g., a semiconductor device including a memory 203), an SEU detection circuit 204, an SEU management circuit 206, and an EHR measurement generator 208. The EHR measurement circuit 200 may receive input data 210, and generate output data 212, data status signal 214 indicating whether the output data 212 is valid, an SEU log signal 216 including SEU information (e.g., SEU counts, errors, and corresponding timestamps), and an EHR value 218. In the example of FIG. 2, the EHR measurement circuit 200 and its components are implemented in a single IC. In other embodiments, various combinations of the components (e.g., device 202, SEU detection unit 204, SEU management unit 206, EHR measurement generator 208) may be implemented in two or more ICs.

In some embodiments, the device 202 receives the input data 210. The input data 210 may be written to the memory 203. Data 212 may be read out from the memory 203.

In some embodiments, the SEU detection circuit 204 performs SEU detection for the device 202, and generates SEU information including SEU counts over a particular period. In some examples, such SEU information (e.g., SEU counts, errors, and corresponding timestamps) may be written in an SEU log, which is sent in the SEU log signal 216. In some embodiments, the SEU detection circuit 204 may provide SEU information with a high time resolution (e.g., in milliseconds).

In some embodiments, the SEU detection circuit 204 may perform SEU detection of the memory 203 of the device 202, and generate a data status signal 214 indicating the error status of the output data 212. The device 202 may be an FPGA device, and the memory 203 may include a configuration memory, BRAM, URAM, and/or any other suitable memory of the FPGA device 202. Various SEU detection techniques may be used. In an example, the SEU detection circuit 204 may read back data from the memory, and perform a bit by bit comparison of that data against data known to be correct. In another example, a memory read back technique with cyclic redundancy check (CRC) is used for SEU detection, where the SEU detection circuit 204 verifies a checksum (e.g., a CRC checksum) for the expected value of the corresponding memory elements. In that example, by using a checksum, the inefficient bit-for-bit comparison is avoided.

In some embodiments, the SEU detection circuit 204 provides the SEU information to an SEU management circuit 206. The SEU management circuit 206 may perform various SEU management processes associated with the device 202. In some embodiments, the SEU management processes include SEU mitigation processes. For example, for memory and other data-related devices, SEU mitigation processes may include the use of parity checking and/or a Hamming, Reed-Solomon (RS), or convolutional code schemes. For further example, for control-related devices, control-related SEU mitigation techniques include redundant systems, watchdog timers, error detection and correction (EDAC), and current limiting.

In some embodiments, the SEU management processes include SEU correction processes. In an example, SEU error correction includes a complete reconfiguration of a configuration memory using data known to be correct, which can be inefficient. In another example, for SEU correction, reconfiguration is performed only on data frame(s) identified as containing an upset bit, rather than reconfiguring the entire configuration memory. In yet another example, total reconfiguration, or "scrubbing", is performed based on anticipated rather than actually detected SEUs.

In some embodiments, the SEU detector 204 sends the SEU information to the EHR measurement generator 208, which generates an EHR value based on the SEU information in an instantaneous dynamic mode. In other words, the EHR value is generated instantly based on the received SEU information, and changes dynamically based on the updated SEU information from the SEU detector 204. In an example, the SEU information includes an SEU count N (e.g., 100) of a memory 203 of a size of M bytes (e.g., 1024 bytes) over a particular time period T (e.g., 1 second). The EHR measurement generator 208 may compute an EHR value E for the device 202 as follows:

$$E = N/(M*T).$$

Figure 3:
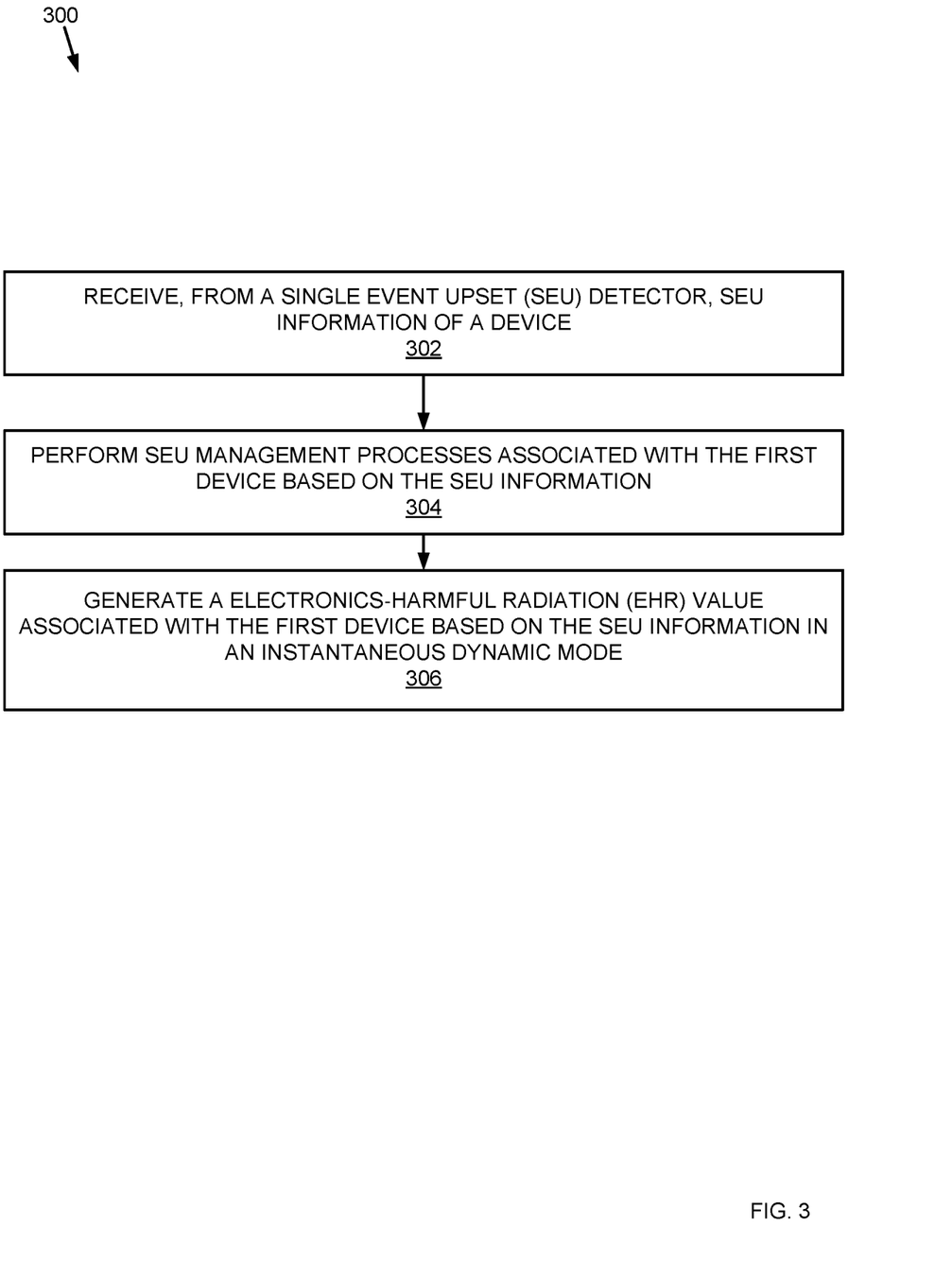
FIG. 3 is a flow diagram illustrating an exemplary method for EHR measurement according to some embodiments of the present disclosure.

Referring to the example of FIG. 3, a method for EHR measurement is illustrated. The method 300 begins at block 302, where SEU information of a first device is received from an SEU detector. In the example of FIG. 2, at block 302, an EHR measurement generator 208 of an EHR measurement circuit 200 receives SEU information of a device 202 from the SEU detection circuit 204.

The method 300 may proceed to block 304, where SEU management processes associated with the first device are performed based on the SEU information. In the example of FIG. 2, at block 304, an SEU management circuit 206 may perform various SEU management processes (e.g., mitigation and/or correction processes) associated with the device 202 based on the SEU information.

The method 300 may proceed to block 306, where an EHR value associated with the first device is generated based on the SEU information in an instantaneous dynamic mode. In the example of FIG. 2, at block 306, the EHR measurement generator 208 generates an EHR value associated with the first device based on the SEU information in an instantaneous dynamic mode.

Figure 4:
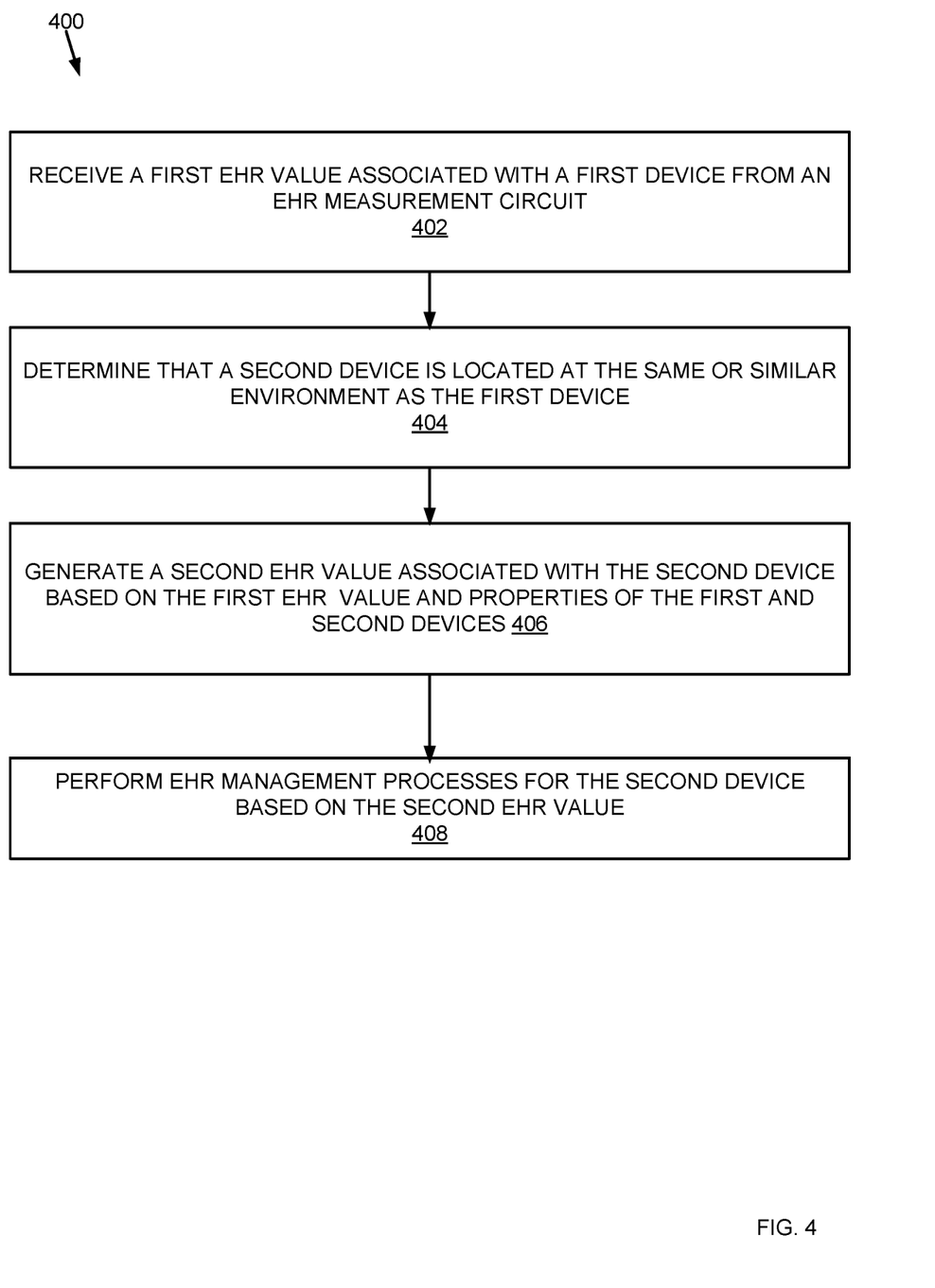
FIG. 4 is a flow diagram illustrating an exemplary method for EHR monitoring according to some embodiments of the present disclosure.
Figure 5:
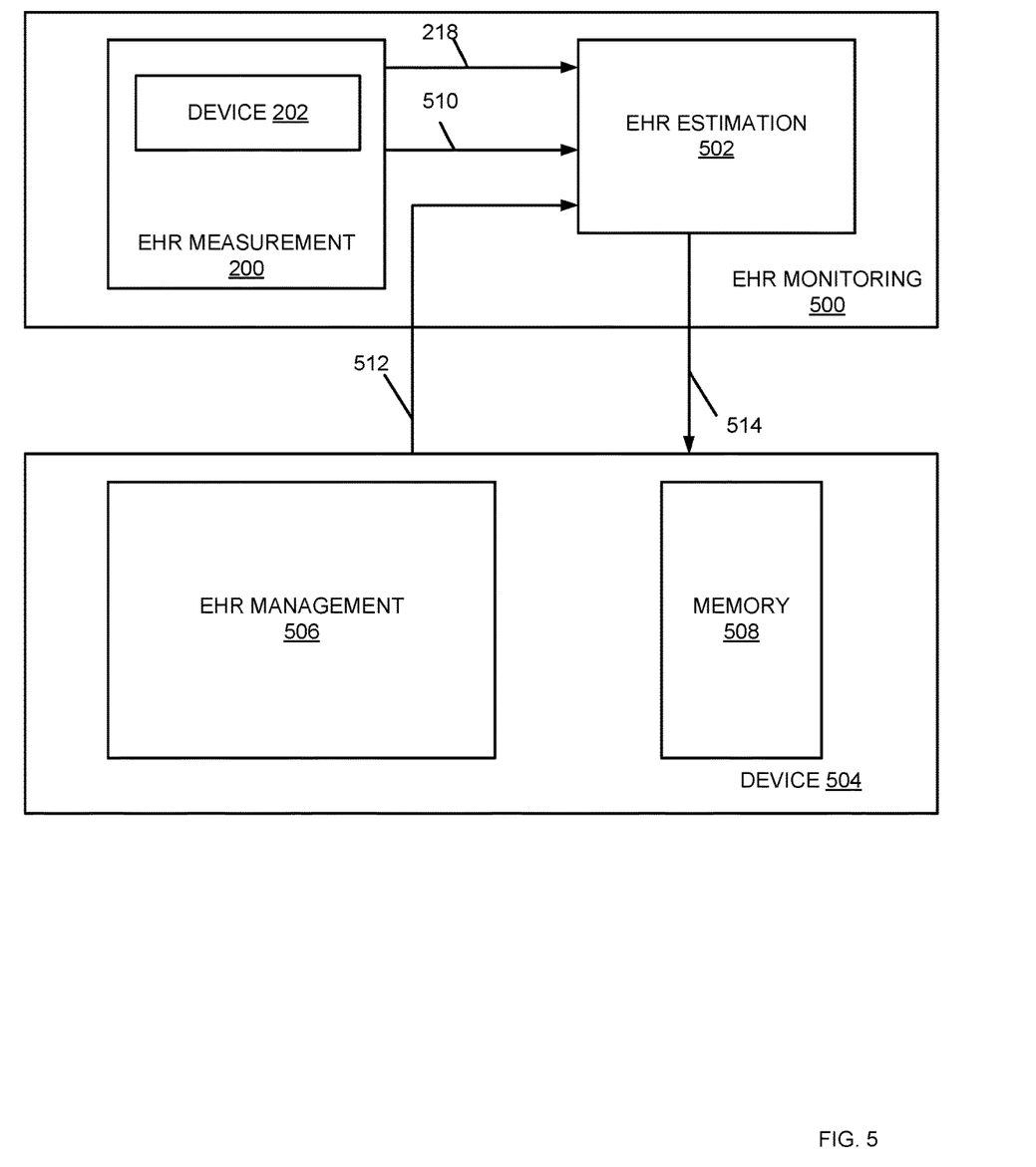
FIG. 5 is a block diagram illustrating an EHR monitoring system according to some embodiments of the present disclosure.

Referring to FIGS. 4 and 5, in some embodiments, the EHR value provided by the EHR measurement circuit based on SEU information of a first device may be used to predict and/or monitor EHR associated with a second device that is different from the first device.

FIG. 4 illustrates a method 400 for EHR monitoring for a second device based on EHR measurements associated with a first device.

FIG. 5 illustrates an EHR monitoring system including an EHR estimation circuit for providing EHR value associated with a second device based on the EHR measurement associated with a first device. In the example of FIG. 5, an EHR monitoring system 500 includes an EHR measurement circuit 200 and an EHR estimation circuit 502. The EHR estimation circuit 502 may receive first EHR value 218 and first device information 510 from the EHR measurement circuit 200, and receive second device information 512 from a second device 504. The EHR estimation circuit 502 may then perform EHR estimation for the second device 504, and generate an EHR value for the second device 504. In various embodiments, the EHR estimation circuit 502 may be implemented in the same IC or in a separate IC from the EHR measurement circuit 200. In some embodiments, the second device 504 is in a separate IC from the EHR measurement circuit 200.

The method 400 begins at block 402, where a first EHR value associated with a first device is received from an EHR measurement circuit. In the example of FIG. 5, at block 402, the EHR estimation circuit 502 receives a first EHR value 218 associated with a first device 202 from the EHR measurement circuit 200.

The method 400 may proceed to block 404, where it is determined that a second device is located in the same or similar environment as the first device. In the example of FIG. 5, at block 404, the EHR estimation circuit 502 receives first device information 510 from the EHR measurement circuit 200, and receives second device information 512 from the second device 504. The first device information 510 and second device information 512 may include location information of the first device 202 and second device 504 respectively. In some examples, the location information may be provided by location components (e.g., a Global Positioning System (GPS) device, a cell tower triangulation device, and/or a variety of other location determination devices known in the art) of the first device 202 and second device 504. The EHR estimation circuit 502 may determine that the first device 202 and second device 504 are located in the same or similar environment (e.g., in a same spacecraft) based on the location information.

The method 400 may then proceed to block 406, where a second EHR value associated with the second device is generated based on the first EHR value associated with the first device and various device information (e.g., technology nodes, device types, and other suitable device information) of the first device and second device.

In some embodiments, the second EHR value is determined based on the semiconductor technology nodes of the first and second devices. In the example of FIG. 5, at block 406, the EHR estimation circuit 502 receives first device information 510 including technology node information indicating that the first device 202 is fabricated with a first technology node (e.g., 16 nm), and second device information 512 including technology node information indicating that the second device 504 is fabricated with a second technology node (e.g., 10 nm).

In various embodiments, the EHR estimation circuit 502 may generate a second EHR value associated with the second device 504 based on the first EHR value and the first and second technology nodes. In an example, the first and second technology nodes are the same. In that example, the second EHR value is the same as the first EHR value. In another example, the first and second technology nodes are different. In that example, the second EHR value is determined by applying a correction value associated with the first and second technology nodes derived experimentally or theoretically to the first EHR value. In that example, the second EHR value may be different from the first EHR value.

In some embodiments, the second EHR value is determined based on the device types (e.g., FPGA, ASIC, ASSP) of the first and second devices. In the example of FIG. 5, at block 406, the EHR estimation circuit 502 receives first device information 510 including device type information including a first device type (e.g., FPGA) of the first device 202, and second device type (e.g., ASIC) of the second device 504.

In various embodiments, the EHR estimation circuit 502 may generate a second EHR value associated with the second device 504 based on the first EHR value and the first and second device types. In an example, the first and second device types are the same. In that example, the EHR estimation circuit 502 may not apply any adjustment to the first EHR value based on the device types. In another example, the first and second device types are different. In that example, the EHR estimation circuit 502 may apply a correction value associated with the first and second device types derived experimentally or theoretically to the first EHR value to generate the second EHR value.

The method 400 may then proceed to block 408, where EHR management processes are performed for the second device based on the second EHR value. In the example of FIG. 5, at block 408, the second device 504 may receive the second EHR value 514 from the EHR monitoring system 500. The EHR management circuit 506 may perform values EHR management processes based on the second EHR value 514. In an example, the EHR management circuit 506 provides real-time memory upset predictions for the memory 508 of the second device 504 and other suitable radiation effects. In another example, the EHR management circuit 506 performs various mitigation and correction processes associated with the device 504 and its memory 508. In some embodiments, the mitigation and correction processes are the same as the mitigation and correction processes of block 304 of FIG. 3 performed to the first device 202. In other embodiments, the mitigation and correction processes performed to the second device 504 are different from the mitigation and correction processes of block 304 of FIG. 3 performed to the first device 202 based on the different performance requirements (e.g., criticality, sensitivity, redundancy, accuracy, etc.) of the second device 504 and the first device 202.

It is noted that various configurations illustrated in FIGS. 2 to 5 are exemplary only and not intended to be limiting beyond what is specifically recited in the claims that follow. It will be understood by those skilled in that art that other configurations may be used. In some embodiments, a first EHR is determined using a first IC (e.g., an FPGA IC) manufacturing with a first technology node (e.g., 16 nm). The first EHR may be determined using SEU information of the first IC. The first EHR is used to estimate a second EHR of a second IC where the second IC is at the same location (e.g., on the same board, on a separate board located in a same aircraft). In an example, the second IC is a GPU IC and is manufactured with the same technology node (e.g., 16 nm) as the first IC. In that example, the second EHR is the same as the first EHR. In another example, the second IC is manufactured in a different technology node (e.g., 28 nm) from the first IC. In that example, the second EHR is different from the first EHR (e.g., 30 times higher than the first EHR).

In various embodiments, various suitable corrective actions and mitigation schemes for the second IC may be determined based on the second EHR. Such corrective actions and mitigation schemes include determining and updating a level of ECC, and the frequency and latency of recovery techniques for the second IC, including for example, system reboot/power cycling frequency and data scrubbing frequency. Such corrective actions and mitigation schemes may be updated dynamically in real time as the first EHR changes, e.g., when a system (e.g., a spacecraft) including the first IC and second IC moves from one radiation environment (e.g., at a first location in space) to another radiation environment (e.g., at a second location in space).

One or more elements in the various embodiments may be implemented by software, hardware (e.g., an application specific integrated circuit (ASIC), application-specific standard parts (ASSPs), a logic on a programmable logic IC (e.g., FPGA)), firmware, and/or a combination thereof. The embodiments may be implemented using various hardware resources, such as for example DSP slices, BRAM, and programmable resources of an FPGA; however, in other embodiments, digital signal processors, microprocessors, multi-core processors, memory, and/or other hardware may be used. When implemented in software, the elements of the embodiments of the invention are essentially the code segments to perform the necessary tasks. The program or code segments can be stored in a processor-readable storage medium or device that may have been downloaded by way of a computer data signal embodied in a carrier wave over a transmission medium or a communication link. The processor readable storage device may include any medium that can store information including an optical medium, semiconductor medium, and magnetic medium. Processor readable storage device examples include an electronic circuit; a semiconductor device, a semiconductor memory device, a read-only memory (ROM), a flash memory, an erasable programmable read-only memory (EPROM); a floppy diskette, a CD-ROM, an optical disk, a hard disk, or other storage device, The code segments may be downloaded via computer networks such as the Internet, Intranet, etc.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. An electronics-harmful-radiation (EHR) monitoring system, comprising:
   an EHR measurement circuit comprising:
      a first device;
      a single event upset (SEU) detector circuit configured to determine a first number of SEUs of the first device during a first period; and
      an EHR measurement generator configured to generate a first EHR value based on the first number of SEUs and the first period; and
   an EHR estimation circuit configured to generate a second EHR value associated with a second device based on the first EHR value.
2. The EHR monitoring system of claim 1, wherein the first device includes a memory.

3. The EHR monitoring system of claim 2, wherein the EHR measurement generator is further configured to generate the first EHR value based on a size of the memory.

4. The EHR monitoring system of claim 1, wherein the EHR estimation circuit is configured to determine that the first device and second device are at a similar location.

5. The EHR monitoring system of claim 1, wherein the EHR estimation circuit is configured to:
   determine a first technology node for fabricating the first device;
   determine a second technology node for fabricating the second device; and
   generate the second EHR value based on the first and second technology nodes.

6. The EHR monitoring system of claim 5, wherein the first and second technology nodes are the same.

7. The EHR monitoring system of claim 6, wherein the first and second technology nodes are different.

8. The EHR monitoring system of claim 7, wherein the EHR estimation circuit is configured to:
   determine an EHR correction value associated with the first and second technology nodes; and
   generate the second EHR value by applying the EHR correction value to the first EHR value.

9. The EHR monitoring system of claim 1, wherein the first device is in a first integrated circuit (IC), and
   wherein the second device is in a second IC.

10. The EHR monitoring system of claim 1,
    wherein the first device and second device are at a same location.

11. A method, comprising:
    determining, by a single event upset (SEU) detector circuit, a first number of SEUs of a first device during a first period;
    generating, by an EHR measurement generator, a first EHR value based on the first number of SEUs and the first period; and
    generating a second EHR value associated with a second device based on the first EHR value.

12. The method of claim 11, wherein the first device includes a memory.

13. The method of claim 12, further comprising:
    generating, by the EHR measurement generator, the first EHR value based on a size of the memory.

14. The method of claim 11, further comprising:
    determining that the first device and second device are at a similar location.

15. The method of claim 11, further comprising:
    determining a first technology node for fabricating the first device;
    determining a second technology node for fabricating the second device; and
    generating the second EHR value based on the first and second technology nodes.

16. The method of claim 15, wherein the first and second technology nodes are the same.

17. The method of claim 16, wherein the first and second technology nodes are different.

18. The method of claim 17, further comprising:
    determining an EHR correction value associated with the first and second technology nodes; and
    generating the second EHR value by applying the EHR correction value to the first EHR value.

19. The method of claim 11, wherein the first device is in a first integrated circuit (IC), and
    wherein the second device is in a second IC.

20. The method of claim 11, wherein the first device and second device are at a same location.

\* \* \* \* \*